US007368299B2

(12) United States Patent
Lee et al.

(10) Patent No.: US 7,368,299 B2
(45) Date of Patent: May 6, 2008

(54) MTJ PATTERNING USING FREE LAYER WET ETCHING AND LIFT OFF TECHNIQUES

(75) Inventors: Gill Yong Lee, Boissise-le-Roi (FR); Eugene O'Sullivan, Nyack, NY (US)

(73) Assignees: Infineon Technologies AG, Munich (DE); International Business Machines Corporation, Armonk, NY (US)

(*) Notice: Subject to any disclaimer, the term of this patent is extended or adjusted under 35 U.S.C. 154(b) by 242 days.

(21) Appl. No.: 10/890,767

(22) Filed: Jul. 14, 2004

(65) Prior Publication Data

US 2006/0014305 A1 Jan. 19, 2006

(51) Int. Cl.
*H01L 21/8246* (2006.01)

(52) U.S. Cl. .................................. 438/3; 257/E21.665

(58) Field of Classification Search .................... 438/3, 438/74, 57; 257/295, 421, 422, E21.665, 257/E29, 167
See application file for complete search history.

(56) References Cited

U.S. PATENT DOCUMENTS

| | | | | |
|---|---|---|---|---|
| 5,650,958 | A * | 7/1997 | Gallagher et al. | 365/173 |
| 5,940,319 | A | 8/1999 | Durlam et al. | |
| 6,153,443 | A | 11/2000 | Durlam et al. | |
| 6,165,803 | A | 12/2000 | Chen et al. | |
| 6,358,756 | B1 | 3/2002 | Sandhu et al. | |
| 6,365,419 | B1 * | 4/2002 | Durlam et al. | 438/3 |
| 6,426,012 | B1 | 7/2002 | O'Sullivan et al. | |
| 6,518,588 | B1 | 2/2003 | Parkin et al. | |
| 6,521,931 | B2 | 2/2003 | Sandhu et al. | |
| 6,555,858 | B1 * | 4/2003 | Jones et al. | 257/295 |
| 6,572,917 | B2 | 6/2003 | Narisawa et al. | |
| 6,635,499 | B1 | 10/2003 | Signorini | |
| 6,638,774 | B2 | 10/2003 | Raberg | |
| 6,656,372 | B2 * | 12/2003 | Yates | 216/22 |
| 6,703,676 | B2 | 3/2004 | Hirai et al. | |
| 6,709,874 | B2 | 3/2004 | Ning | |
| 6,713,802 | B1 | 3/2004 | Lee | |
| 6,783,995 | B2 * | 8/2004 | Hineman et al. | 438/3 |
| 6,897,532 | B1 * | 5/2005 | Schwarz et al. | 257/367 |
| 6,927,467 | B2 * | 8/2005 | Kim | 257/421 |
| 7,001,783 | B2 | 2/2006 | Costrini et al. | |
| 7,064,974 | B2 * | 6/2006 | Suzuki et al. | 365/158 |
| 2001/0024347 | A1 | 9/2001 | Shimazawa et al. | |
| 2002/0105035 | A1 | 8/2002 | Sandhu et al. | |
| 2002/0145835 | A1 * | 10/2002 | Suzuki et al. | 360/324.2 |
| 2003/0035251 | A1 * | 2/2003 | Asida et al. | 360/322 |

(Continued)

FOREIGN PATENT DOCUMENTS

| | | |
|---|---|---|
| EP | 1 054 449 A2 | 11/2000 |

(Continued)

*Primary Examiner*—Zandra V. Smith
*Assistant Examiner*—Toniae M Thomas
(74) *Attorney, Agent, or Firm*—Slater & Matsil, L.L.P.

(57) ABSTRACT

Methods of patterning magnetic tunnel junctions (MTJ's) of magnetic memory devices, wherein the second magnetic layer or free layer of a magnetic stack may be patterned using a wet etch technique. A cap layer is formed over the free layer after the free layer is patterned. The cap layer is formed using lift-off techniques. To form the cap layer, resist layers are deposited and patterned, and material layers are deposited over the resist layers. Portions of the material layers are removed when the resist is stripped.

35 Claims, 6 Drawing Sheets

U.S. PATENT DOCUMENTS

2003/0068897 A1* 4/2003 Yates ........................ 438/710
2003/0199104 A1* 10/2003 Leuschner et al. ............. 438/3
2004/0026369 A1 2/2004 Ying et al.
2004/0029393 A1* 2/2004 Ying et al. .................. 438/745
2004/0043579 A1 3/2004 Nuetzel et al.
2004/0084400 A1* 5/2004 Costrini et al. ............... 216/22
2004/0087039 A1* 5/2004 Gupta et al. ................... 438/3
2004/0106245 A1* 6/2004 Butcher et al. ............. 438/197
2004/0229430 A1 11/2004 Findels et al.
2005/0282295 A1* 12/2005 Raberg .......................... 438/3
2006/0051881 A1* 3/2006 Ditizio .......................... 438/3

FOREIGN PATENT DOCUMENTS

WO WO 02/063658 A2 8/2002

* cited by examiner

MTJ PATTERNING USING FREE LAYER WET ETCHING AND LIFT OFF TECHNIQUES

This invention was made with U.S. Government support under MDA972-99-C-0009 awarded by the Defense Advanced Research Projects Agency (DARPA). The U.S. Government has certain rights in this invention.

CROSS-REFERENCE TO RELATED APPLICATIONS

This application relates to the following co-pending and commonly assigned patent applications: Ser. No. 10/868,328, filed on Jun. 15, 2004, entitled "Mask Schemes for Patterning Magnetic Tunnel Junctions," and Ser. No. 10/870,756, filed on Jun. 17, 2004, entitled "Methods of Patterning a Magnetic Stack of a Magnetic Memory Cell and Structures Thereof," which applications are hereby incorporated herein by reference.

TECHNICAL FIELD

The present invention relates generally to semiconductor devices, and more particularly to the fabrication of magnetic memory devices.

BACKGROUND

A recent development in semiconductor memory devices involves spin electronics, which combines semiconductor technology and magnetics. The spin of electrons, rather than the charge, is used to indicate the presence of a "1" or "0." One such spin electronic device is a magnetic random access memory (MRAM) device which includes conductive lines (wordlines and bitlines) positioned in a different direction, e.g., perpendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data. Therefore, it is expected that MRAM devices will replace flash memory, DRAM and static random access memory devices (SRAM) devices in electronic applications where a memory device is needed.

Because MRAM devices operate differently than traditional memory devices, they introduce design and manufacturing challenges. The magnetic material layers used in MRAM devices require different etch chemistries and processes than traditional materials used in semiconductor processing, making them difficult to integrate into MRAM manufacturing processing schemes.

SUMMARY OF THE INVENTION

Embodiments of the present invention achieve technical advantages by providing a novel method and structure for an MRAM, wherein the second magnetic layer or free layer of an MTJ may be patterned using a wet etch process, preventing the formation of metal fences on the sidewalls of various material layers of the MTJ's. A cap layer is formed over the free layer after the free layer is patterned. Lift-off techniques are used to form the cap layer. In one embodiment, a resist is deposited over the free layer and tunnel insulator. The resist is patterned to expose at least a portion of the free layer. The cap layer material is deposited over the resist, and the resist is removed, also removing excess portions of the cap layer material, leaving the cap layer residing over at least a portion of the free layer. In another embodiment, with a resist formed over the free layer, a hard mask is deposited over the resist and tunnel insulator, and the resist is removed, also removing the hard mask from over the free layer. The cap layer material is deposited over the hard mask and exposed free layer, and the hard mask is patterned, leaving the hard mask residing over the free layer.

In accordance with a preferred embodiment of the present invention, a method of manufacturing a semiconductor device includes providing a workpiece, depositing a first magnetic layer over the workpiece, depositing a tunnel insulator over the first magnetic layer, and depositing a second magnetic layer over the tunnel insulator. The second magnetic layer, tunnel insulator, and first magnetic layer form a magnetic stack. The second magnetic layer, tunnel insulator, and first magnetic layer are patterned, wherein the second magnetic layer comprises a first pattern and the tunnel insulator and the first magnetic layer comprise a second pattern. The second pattern is larger than the first pattern and the second magnetic layer comprises a top surface. After patterning the second magnetic layer, a cap layer is formed over at least a substantial portion of the top surface of the second magnetic layer.

In accordance with another preferred embodiment of the present invention, a method of manufacturing an MRAM device includes forming a plurality of first conductive lines over a workpiece, the first conductive lines being positioned in a first direction, and forming a plurality of MTJ's over the first conductive lines, wherein each MTJ is disposed over one of the first conductive lines. The MTJ's include a first magnetic layer, a tunnel insulator disposed over the first magnetic layer, and a second magnetic layer disposed over the tunnel insulator. The second magnetic layer comprises a first pattern and the tunnel insulator and the first magnetic layer comprise a second pattern, the second pattern being larger than the first pattern, and the second magnetic layer comprises a top surface. The method includes depositing a resist over at least the second magnetic layer and the tunnel insulator, patterning the resist to expose at least a portion of the second magnetic layer top surface, and depositing a cap layer material over the resist and exposed at least a portion of the second magnetic layer top surface. The resist is removed, wherein removing the resist comprises removing excess cap layer material disposed over the resist, leaving a cap layer over the at least a portion of the second magnetic layer top surface of each MTJ. A plurality of second conductive lines are formed over the cap layer of the MTJ's, the second conductive lines being positioned in a second direction, the second direction being different from the first direction, wherein each second conductive line abuts the cap layer over an MTJ.

In accordance with another preferred embodiment of the present invention, a method of manufacturing an MRAM device includes forming a plurality of first conductive lines over a workpiece, the first conductive lines being positioned in a first direction, and forming a plurality of MTJ's over the first conductive lines, wherein each MTJ is disposed over one of the first conductive lines. The MTJ's include a first magnetic layer, a tunnel insulator disposed over the first magnetic layer, and a second magnetic layer disposed over the tunnel insulator. The second magnetic layer comprises a first pattern, and the tunnel insulator and the first magnetic layer comprise a second pattern, the second pattern being larger than the first pattern. The second magnetic layer comprises a top surface. The method includes forming a first resist over at least the second magnetic layer and the tunnel insulator, depositing a hard mask over the first resist and the tunnel insulator, and removing the first resist, wherein removing the first resist comprises removing the hard mask over the first resist. A cap layer material is deposited over the hard mask and the second magnetic layer, a second resist is deposited over the cap layer material, and the second resist is patterned, leaving the second resist residing over the second magnetic material. The second resist is removed, wherein removing the second resist comprises removing the cap layer material from over the tunnel insulator, leaving a cap layer over the second magnetic layer top surface of each MTJ. A plurality of second conductive lines are formed over the cap layer of the MTJ's, the second conductive lines being positioned in a second direction, the second direction being different from the first direction, wherein each second conductive line abuts the cap layer over an MTJ.

In accordance with yet another embodiment of the present invention, a magnetic memory device includes a workpiece, a first magnetic layer disposed over the workpiece, a tunnel insulator disposed over the first magnetic layer, and a second magnetic layer disposed over the tunnel insulator. The first magnetic layer, the tunnel insulator, and the second magnetic layer comprise at least one MTJ. The second magnetic layer comprises a first pattern, and the tunnel insulator and the first magnetic layer comprise a second pattern, the second pattern being larger than the first pattern. A cap layer is disposed over at least the second magnetic layer. The cap layer comprises a third pattern, wherein the third pattern is either larger or smaller than the first pattern, and wherein the third pattern is smaller than the second pattern.

Advantages of preferred embodiments of the present invention include providing methods of patterning MTJ's of MRAM devices wherein a wet etch process may be used to pattern the top magnetic material layer. A cap layer is then formed over the patterned top magnetic material layer using a lift-off technique, wherein when the resist is removed, a material disposed over the resist is also removed. Because a wet etching process is used to pattern the top magnetic material layer of the MTJ, lateral etching of the top magnetic material layer is reduced or eliminated. MRAM devices with improved performance and increased yields are achieved by embodiments of the invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely field effect transistor (FET) MRAM devices. In FET MRAM devices, each magnetic memory cell is located proximate an FET that is used to access, e.g., read from or write to, the magnetic memory cell (or MTJ.) Embodiments of the present invention may also be applied, however, to cross-point MRAM devices, other magnetic memory devices and other semiconductor devices having magnetic material layers, as examples.

Only one MTJ is shown in each of the figures. However, a plurality of MTJ's may be simultaneously formed using the manufacturing processes described herein. For example, an array of MTJ's may be patterned using embodiments of the present invention.

Figure 1:
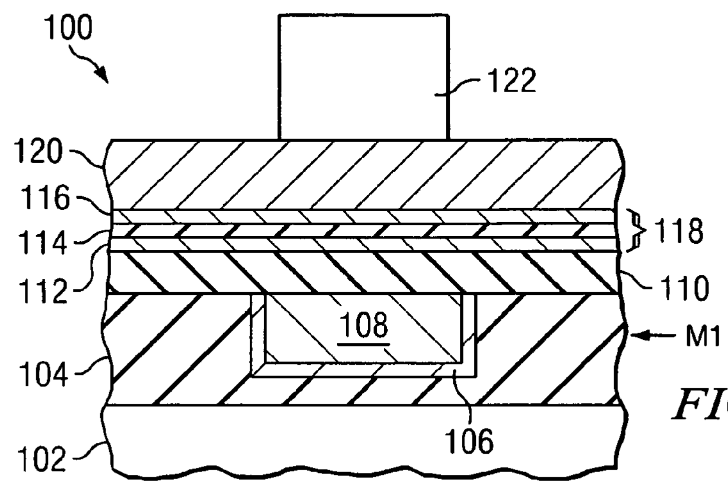
FIGS. 1 through 3 show cross-sectional views of an MRAM device in various stages of manufacturing using a less-preferred manufacturing method, wherein metallic fences form on the sidewalls of the magnetic stack and cap layer, causing shorts to conductive lines in subsequently formed metallization layers.
Figure 2:
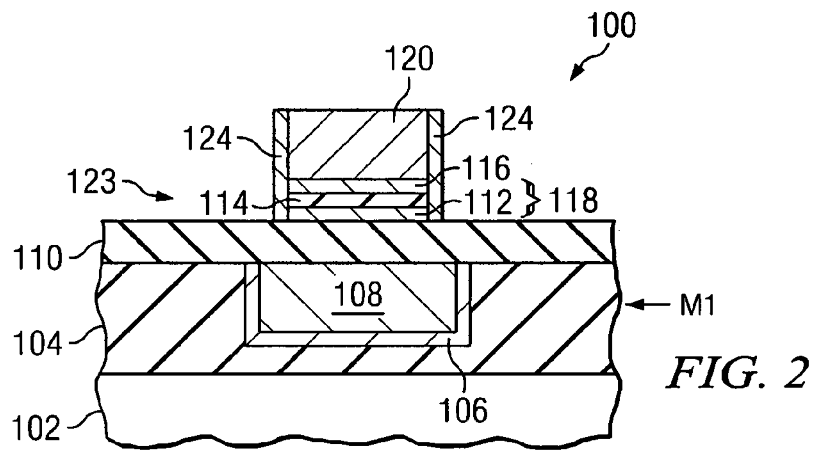
Figure 3:
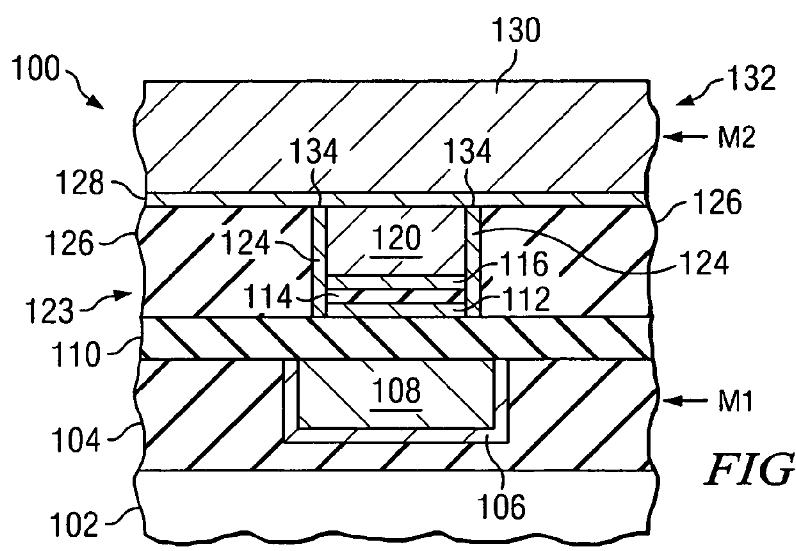

FIGS. 1 through 3 show cross-sectional views of an MRAM device 100 at various stages of manufacturing using a less-preferred method. A first insulating layer 104 is formed over a workpiece 102, and first conductive lines 106/108 are formed within the first insulating layer 104 in an M1 metallization layer or other level metallization layer. The workpiece 102 may include component regions or various circuit elements formed therein (not shown). The first conductive lines 106/108 include a conductive liner 106 formed over the patterned first insulating layer 104 and a conductive material 108, and may be formed in a damascene process, for example. An optional second insulating layer 110 may be formed over the first insulating layer 104 (for example, in a FET MRAM array. The second insulating layer 110 is typically not used in a crosspoint MRAM array, for example.)

A magnetic stack 118 from which MTJ's 123 (see FIGS. 2 and 3) will be formed is deposited over the second insulating layer 110. The magnetic stack 118 includes a first magnetic layer 112 deposited over the second insulating layer 110, and a tunnel insulator 114 formed over the first magnetic layer 112. A second magnetic layer 116 is deposited over the tunnel insulator 114. The first magnetic layer 112 and the second magnetic layer 116 each typically comprise one or more layers of magnetic materials and/or metal materials, for example. The first magnetic layer 112 may comprise a seed layer of Ta and/or TaN (e.g., about 50 Angstroms of TaN and about 50 Angstroms of Ta), an antiferromagnetic layer such as PtMn having a thickness of about 175 Angstroms disposed over the seed layer, and one or more magnetic material layers comprising CoFe, NiFe, CoFeB, Ru, other materials, or combinations thereof (e.g., a first layer of CoFe having a thickness of about 18 Angstroms, a thin layer of Ru having a thickness of about 9 Angstroms, and a second layer of CoFe having a thickness of about 18 Angstroms), disposed over the antiferromagnetic layer, as examples, although alternatively, the first magnetic layer 112 may comprise other materials and thicknesses. The first magnetic layer 112 is also referred to as a fixed layer because its magnetic polarity is fixed. The second magnetic layer 116 may comprise a thickness of about 50 Angstroms or less of one or more magnetic material layers comprising CoFe, NiFe, CoFeB, other magnetic material layers, or combinations thereof, although alternatively, the second magnetic layer 116 may comprise other materials. The second magnetic layer 116 is also referred to as a free layer because its magnetic polarity changes when the magnetic memory cell is written to. The tunnel insulator 114 may comprise about 10 to 20 Angstroms of an insulator such as $Al_2O_3$, for example, although alternatively, other insulating materials may be used for the tunnel insulator 114.

A cap layer 120 is deposited over the second magnetic layer 116 of the magnetic stack 118. The cap layer 120 typically comprises tantalum nitride (TaN), as an example. The cap layer 120 and magnetic stack 118 layers are patterned using traditional lithography techniques and a dry etch process, e.g., by depositing a photoresist 122 over the cap layer 120, and using the photoresist 122 as a mask while the cap layer 120 and the magnetic stack 118 layers are etched. The cap layer 120 may be used as a hard mask to pattern at least a portion of the magnetic stack 118, for example. The first magnetic layer 116 may be patterned with a different pattern than the second magnetic layer 112 pattern, using an additional lithography step, for example (not shown in the figures.) The cap layer 120 is conductive and provides thermal and magnetic stability for the MTJ 123. The cap layer 120 is typically left remaining in the completed MRAM device 100.

A problem with the less-preferred magnetic stack patterning method shown in FIG. 1 is that the cap layer 120 typically comprises a material that is etchable with a dry etch process, rather than a wet etch process. The magnetic layers 112 and 116, and the tunnel insulator 114 comprise materials that are etchable by a wet etch process. It is desirable to use a wet etch process to etch the magnetic layers 112 and 116, and the tunnel insulator 114, because dry etch processes often result in re-deposition of material on vertical sidewalls, as shown in FIG. 2. For example, a dry etch may comprise a sputter etch process, which involves physically bombarding a material surface to remove material. Often during a sputter process, portions of the material are removed simultaneously while other portions of material are deposited, with a net result of removal of material being the goal. In particular, a reactive ion etch (RIE) process is one type of etching method that may be used to etch the magnetic layers 112 and 116 and tunnel insulator 114. The RIE processes for PtMn and Ta have a high sputter component and are materials that are difficult to etch, that also have a tendency to re-deposit on sidewalls of vertical structures. Because some of the materials being etched are conductive, conductive fences 124 may form on sidewalls of the MTJ 123, resulting in shorts to upper metallization layers, as a result of the dry etch process.

As shown in FIG. 3, after the MTJ 123 is patterned, a third insulating layer 126 is formed between the MTJ's 123, and second conductive lines 128/130 are formed in a metallization layer (M2) above the MTJ 123. The second conductive lines 128/130 may be formed in a damascene process within a fourth insulating layer 132, and the second conductive lines 128/130 may include a liner 128 and a conductive material 130 disposed over the liner 128. The fourth insulating layer 132 and the third insulating layer 126 may comprise a single insulating layer, for example. If conductive fences 124 are formed over sidewalls of the MTJ 123, shorts 134 can occur between the conductive lines 128/130 and the MTJ 123, rendering the device 100 inoperable. The shorts form at 134 where the metal fences 124 abut the conductive liner 128 of the second conductive lines 128/130. This is problematic because the shorts 134 cause device failures and decreased yields.

Wet etch processes are desirable for patterning MRAM magnetic layers because they result in minimal or no re-deposition of conductive material on sidewalls of structures. Wet etch processes also result in minimal lateral etching in the case of MRAM devices due to thin nature of the magnetic layers relative to their x-y dimensions, providing improved control over the patterning process. Wet etch processes for patterning magnetic layers and patterning passivating layers over magnetic layers are described in U.S. Pat. No. 6,426,012, entitled "Wet Chemical Etch Process for Patterning MRAM Magnetic Layers," issued on Jul. 30, 2002 to O'Sullivan, et al., which is hereby incorporated herein by reference.

Embodiments of the present invention provide methods of forming MTJ's and cap layers over the MTJ's, wherein the free layer or top magnetic layer of a magnetic stack may be patterned by wet etching processes. The cap layer is deposited after the free layer of the magnetic stack is patterned. Advantageously, a wet etch process is not required to pattern the cap layer. The cap layer is formed over the patterned free layer using lift-off techniques, to be described further herein.

FIGS. 4 through 9 illustrate cross-sectional views of an MRAM device manufactured in accordance with preferred embodiments of the present invention at various stages of manufacturing, wherein a free layer of an MTJ is patterned using a wet etch process. Note that like numerals are used for the various elements in FIGS. 4 through 13 as were described with reference to FIGS. 1 through 3.

To avoid repetition, each reference number shown in the diagram may not necessarily be described again in detail herein. Rather, similar materials x02, x04, x06, x08, etc . . . are preferably used for the material layers shown as were described for FIGS. 1 through 3, where x=1 in FIGS. 1 through 3 and x=2 in FIGS. 4 through 13. As an example, the preferred and alternative materials and dimensions described for first magnetic layer 112 in the description for FIGS. 1 through 3 are preferably also used for first magnetic layer 212 in FIGS. 4 through 13.

Figure 4:
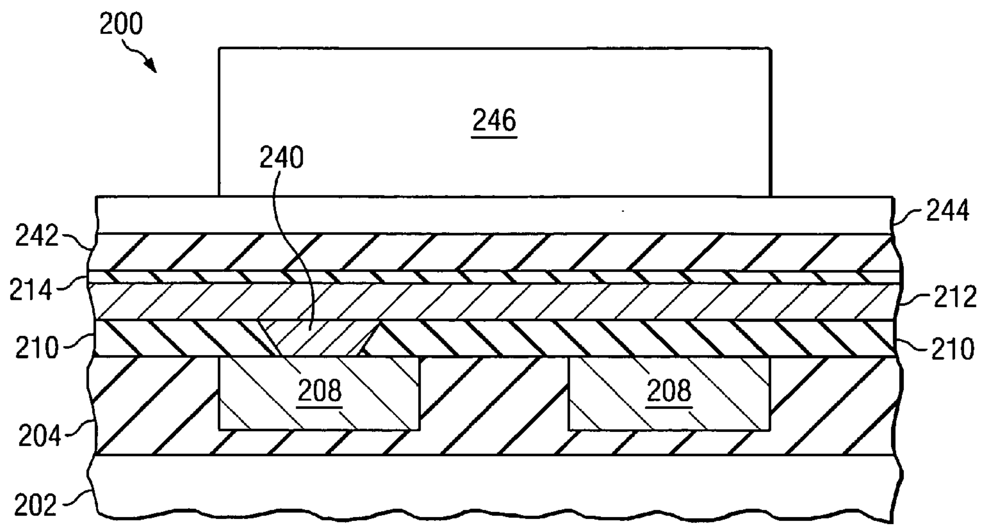
FIGS. 4 through 9 illustrate cross-sectional views of an MRAM device manufactured in accordance with preferred embodiments of the present invention at various stages of manufacturing, wherein a free layer of an MTJ is patterned using a wet etch process.

Referring first to FIG. 4, a workpiece 202 is provided. The workpiece 202 may include a semiconductor substrate comprising silicon or other semiconductor materials covered by an insulating layer, for example. The workpiece 202 may also include other active components or circuits formed in a front end of line (FEOL), not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon. For example, the workpiece 202 may include component regions or various circuit elements formed therein.

A first insulating layer 204 is deposited over the workpiece 202. The first insulating layer 204 preferably comprises silicon dioxide and may alternatively comprise low dielectric constant materials, other insulating materials, or combinations or multiple layers thereof, as examples. The first insulating layer 204 may alternatively comprise other materials, for example.

A plurality of first conductive lines 208 are formed within the first insulating layer 204. The first conductive lines 208 may include an optional conductive liner (not shown), and a conductive material disposed over and filling the liner, for example. Alternatively, the first conductive lines 208 may comprise a single material, or two or more materials, for example. The conductive material may comprise copper, aluminum, or combinations thereof, as examples, although alternatively, the conductive material may comprise other conductive materials. The first conductive lines 208 may be formed in a damascene process, for example. Alternatively, the first conductive lines 208 may be formed using a subtractive etch process, for example. The first conductive lines 208 function as wordlines or bitlines of the MRAM device 200, for example, and are used to access each MTJ.

A second insulating layer 210 is deposited over the first insulating layer 204 and conductive lines 208. The second insulating layer 210 may comprise silicon nitride or other insulators such as silicon dioxide, as examples. The second insulating layer 210 may comprise an inter-level dielectric (ILD) in which vias 240 may be formed to make contact to underlying first conductive lines 208, as shown.

A first magnetic layer 212 is deposited over the second insulating layer 210, as shown in FIG. 4. A tunnel insulator 214 is deposited over the first magnetic layer 212. At this point, a second magnetic layer 216 may be deposited over the tunnel insulator 214 (not shown in FIG. 4; see FIG. 6). The second magnetic layer 216 may reside over the tunnel insulator 214 during the patterning of the tunnel insulator 214 and first magnetic layer 212, in one embodiment (not shown).

An optional disposable hard mask 242 is deposited over the tunnel insulator 214, as shown in FIG. 4 (or over the second magnetic layer 216, if present). The optional hard mask 242 may comprise an oxide, spin-on glass, or a spin-on polymer, as examples, although alternatively, the hard mask 242 may comprise other materials. An optional anti-reflective coating (ARC) 244 may be deposited over the optional hard mask 242, as shown. A layer of photoresist 246 is deposited over the ARC 244 (or over the optional hard mask 242, if no ARC 244 is used, or alternatively, over the tunnel insulator 214 or second magnetic layer 216, if no ARC 244 or hard mask 242 is used). The photoresist 246 is then patterned with the desired pattern of the tunnel insulator 214 and first magnetic layer 212. The pattern for the tunnel insulator 214 and the first magnetic layer 212 is also referred to herein as a "second pattern." The pattern for the second magnetic layer 216 (see FIG. 9) is referred to herein as a "first pattern", to be described further herein.

Figure 5:
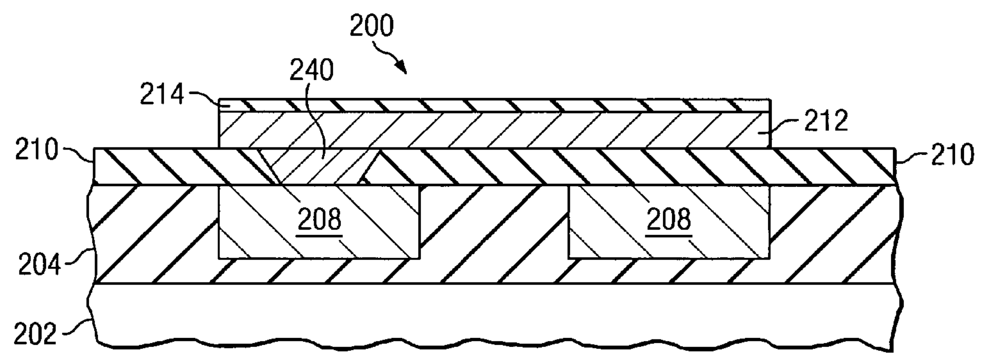

Using the patterned photoresist 246 as a mask, the tunnel insulator 214 and first magnetic layer 212 (and second magnetic layer 216, if present (not shown), and also optional ARC 244 and optional hard mask 242, if present) are patterned, as shown in FIG. 5. The patterning of the tunnel insulator 214 and first magnetic layer 212 may comprise a RIE, for example, although alternatively, other etch processes may be used. The photoresist 246, ARC 244 and hard mask 242 are then removed, leaving the structure shown in FIG. 5, wherein the tunnel insulator 214 and first magnetic layer 212 comprise the second pattern. If the second magnetic layer 216 was deposited over the tunnel insulator 214 prior to the patterning process, the second magnetic layer 216 would also comprise the second pattern at this point (not shown in the figures).

Figure 6:
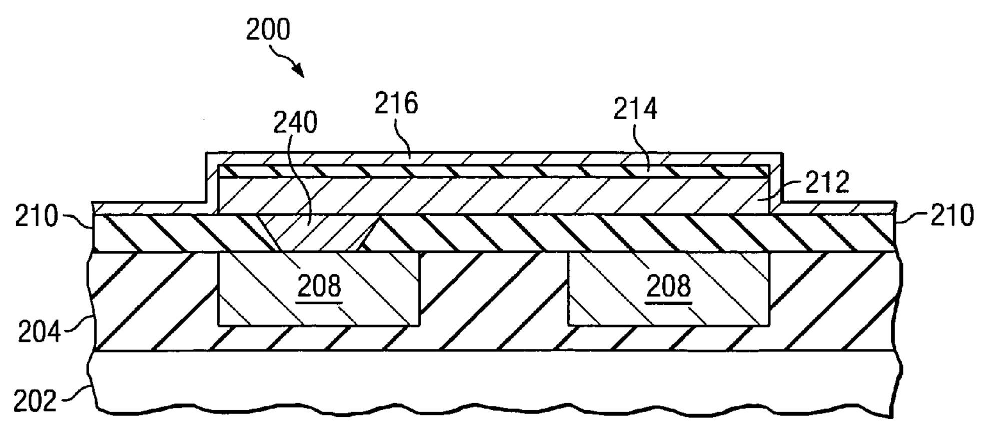

Next, if the second magnetic layer 216 has not yet been deposited, the second magnetic layer 216 is then deposited over the tunnel insulator 214, as shown in FIG. 6. The second magnetic layer 216 may include an optional thin oxidation barrier (not shown) formed on the top surface thereof, comprising a material such as Ru, as an example, although other materials may alternatively be used.

Figure 7:
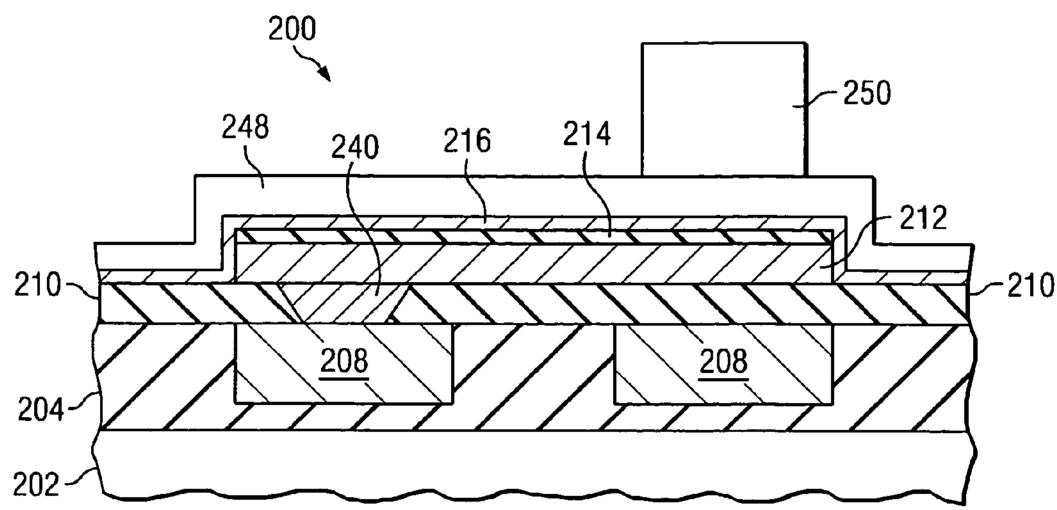

An optional ARC layer 248 may then be deposited over the second magnetic layer 216 (and exposed portions of the second insulating layer 210, if the second magnetic layer 216 was patterned with the second pattern), as shown in FIG. 7. A layer of photoresist 250 is then deposited over the ARC 248, or over the second magnetic layer 216, if the ARC 248 is not used. The photoresist 250 is patterned with the desired first pattern of the second magnetic layer 216, as shown. The first pattern is preferably smaller in a lateral direction than the second pattern.

Note that if no interaction (e.g., chemically) is expected between the photoresist 250 and the second magnetic layer 216 material, the ARC 248 is not required. However, if an ARC 248 is used, preferably, an ARC material that can be wet etched is used for the ARC 248. For example, the ARC 248, if used, preferably comprises a dielectric ARC such as SiON, that it can be wet etched selective to the underlying second insulating layer 210, for example. Some ARC materials require a dry etch and these are preferably not used for ARC 248, according to a preferred embodiment of the invention.

Figure 8:
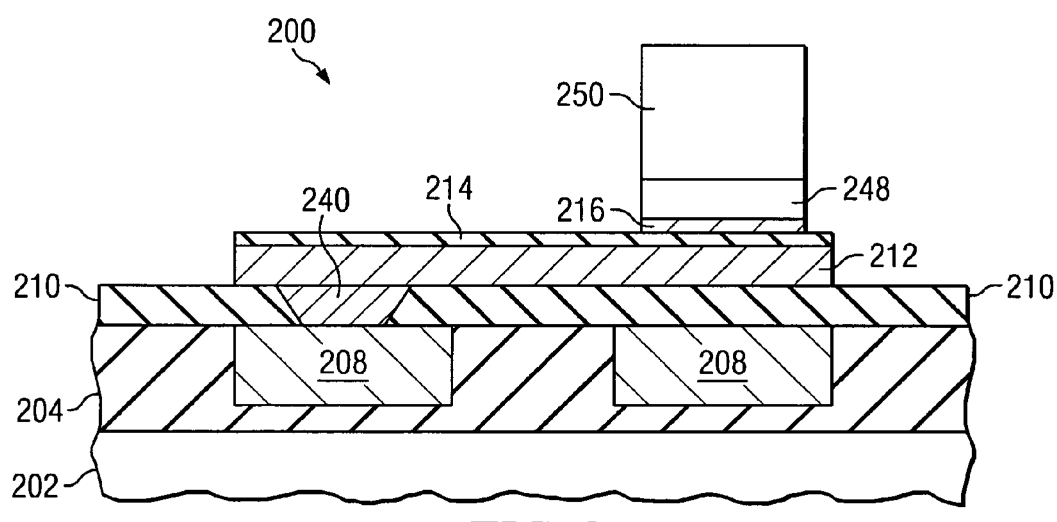

The patterned layer of photoresist 250 is then used as a mask while the optional ARC 248 and the second magnetic layer 216 are patterned with the first pattern, as shown in FIG. 8. The etch process for the second magnetic layer 216 preferably comprises a wet etch process, which is advantageous in that no conductive fences form on the sidewalls of vertical structures, avoiding shorts. Also, the wet etch process also does not etch the second magnetic layer 216 laterally, e.g., parallel to the wafer or workpiece 202 surface.

The wet etch process may comprise a dicarboxylic acid aqueous etchant solution adapted to stop on the tunnel insulator 214 material, for example, as described in U.S. Pat. No. 6,426,012, entitled "Wet Chemical Etch Process for Patterning MRAM Magnetic Layers," issued on Jul. 30, 2002 to O'Sullivan, et al., which as mentioned earlier, is incorporated herein by reference. In particular, the wet etch process may comprise glutaric acid, adipic acid, or suberic acid, as examples, although alternatively, other etch chemistries may be used, for example. The wet etch process may comprise an etchant solution comprising from about 0.5 to about m parts by weight of the dicarboxylic acid per 100 parts by weight water, where m is limited by the solubility of the acid, for example. The wet etching may be at room temperature and may require a time period of about 15 to 1200 seconds, as an example. Preferably, and advantageously, no substantial pitting of the tunnel insulator 214 or first magnetic layer 212 is caused by the wet etch process.

Figure 9:
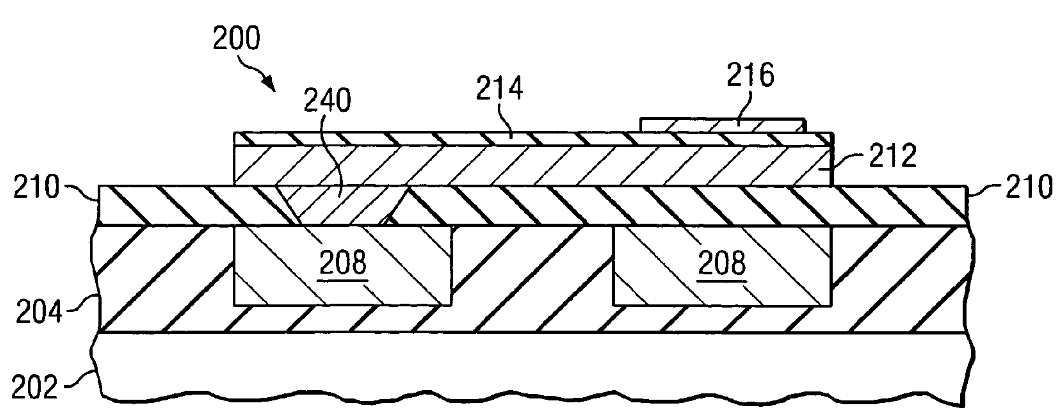

In one embodiment, the photoresist 250 and optional ARC 248 are then stripped or removed, leaving the structure shown in FIG. 9. The second magnetic layer 216 comprises the first pattern at this point in the manufacturing process. The first pattern is preferably smaller than the second pattern. The first pattern comprises the pattern of the MTJ. For example, the second magnetic layer 216 and portions of the tunnel insulator 214 and first magnetic layer 212 that reside beneath the second magnetic layer 216 function as the MTJ. Portions of the first magnetic layer 212 that do not reside under the second magnetic layer 216 may comprise a strap adapted to electrically couple the fixed layer (or bottom magnetic layer 212) of the MTJ to via 240 and conductive line 208, for example.

After the second magnetic layer 216 or free layer of the MTJ is patterned, the novel lift-off techniques in accordance with embodiments of the invention are then used to form a cap layer 262 and 362, as shown in a cross-sectional view in FIGS. 10 through 13 and FIGS. 14 through 18, respectively.

Figure 10:
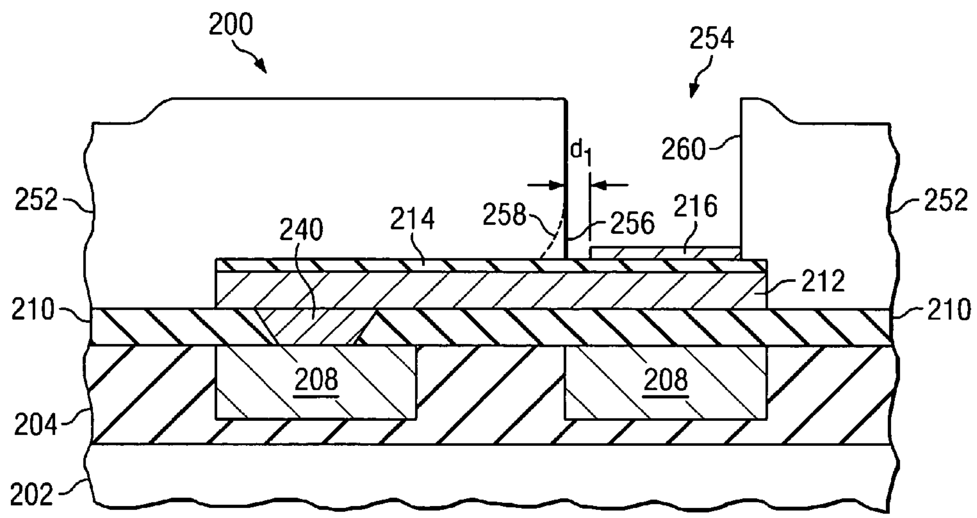
FIGS. 10 through 13 illustrate a preferred embodiment of the present invention at various stages of manufacturing, wherein a photoresist lift-off technique is used to form a cap layer over an MTJ after patterning the free layer of the magnetic stack.

Next, an embodiment of the invention will be described with reference to FIGS. 10 through 13, which illustrate a preferred embodiment of the present invention at various stages of manufacturing in a cross-sectional view, wherein a photoresist lift-off technique is used to form a cap layer 262 over an MTJ after patterning the free layer 216 of the magnetic stack. First, a layer of resist 252 is deposited over the patterned second magnetic layer 216, exposed tunnel insulator 214, and exposed portions of the second insulating layer 210, as shown in FIG. 10. The resist 252 is patterned with the desired pattern for the cap layer 264. The pattern for the cap layer 264 (and resist 252, which is used to form the cap layer 264) is referred to herein as a third pattern.

In one embodiment, the third pattern of the resist 252 is substantially the same size as the first pattern of the second magnetic layer 216, and thus the resist 252 edge lines up with the second magnetic layer 216 edge, as shown in FIG. 10 at 260. The resist 252 profile at the bottom of the trench 254 may comprise a substantially vertical sidewall, for example, as shown. This embodiment is advantageous in that the same lithography mask used to pattern the second magnetic layer 216 may be used to pattern the resist 252. The third pattern may comprise the negative shape of the first pattern of the second magnetic layer 216, for example.

In another embodiment, the resist 252 may be patterned with a third pattern that is slightly larger than the first pattern, as shown at the left of the trench 254 in the resist 252 at 256. For example, the resist 252 may be removed from over the tunnel insulator 214 proximate the second magnetic layer 216 by a distance $d_1$, wherein $d_1$ may comprise the overlay margin of the device. For example, $d_1$ may comprise about 50 nm, although alternatively, $d_1$ may comprise other dimensions. Advantageously, the patterning of the resist 252 and the cap layer 264 is not required to be exact; any misalignment will occur on and be uniform for every MTJ in an MRAM array—thus each MTJ will be impacted by the misalignment equally. In this embodiment, the cap layer 262 that is formed overlays the sidewalls of the second magnetic layer 216 and a portion of the tunnel insulator 214 proximate the second magnetic layer 216, as shown at 264 in phantom in FIGS. 11, 12 and 13.

In one embodiment, the trench 254 in the resist 252 may be negatively sloped at the bottom for a wider process window, which is advantageous for a subsequent physical vapor deposition (PVD) process that may be used to deposit the cap layer 264 material, as shown in phantom at 258 in FIG. 10. The resist profile 252 at the bottom of the trench 254 comprises a sidewall that is slightly sloped inward towards the resist 252, removing more resist 252 over the tunnel insulator 214 proximate the patterned second magnetic layer 216, as shown, for example. The same lithography mask used to pattern the second magnetic layer 216 may be used to pattern the resist 252 in this embodiment. An etch process with an isotropic component may be used to form the negatively sloped trench 254 sidewalls, for example.

Figure 13:
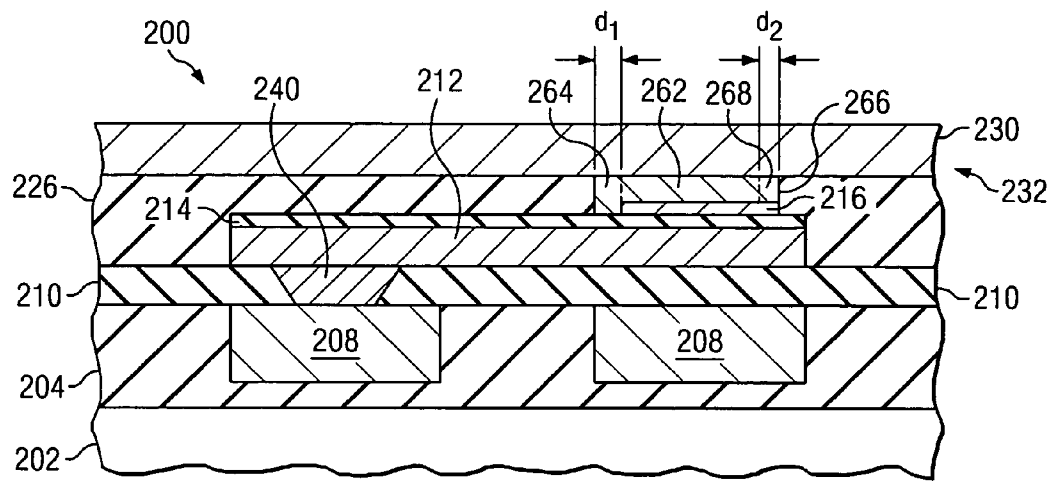

In yet another embodiment, the third pattern for the resist 252 may be smaller than the first pattern for the second magnetic layer 216, as shown in FIG. 13 in phantom at 268. In this embodiment, the cap layer 262 third pattern is slightly smaller than the first pattern of the second magnetic layer 216. This embodiment is advantageous because the MTJ short yield can be improved. For example, the resist 252 may be removed from over the second magnetic layer 216 edges by a distance $d_2$, wherein $d_2$ may comprise the overlay margin of the device. For example, $d_2$ may comprise about 50 nm, although alternatively, $d_2$ may comprise other dimensions. Again, advantageously, the patterning of the resist 252 and the cap layer 264 is not required to be exact; any misalignment will occur on and be uniform for every MTJ in an MRAM array, impacting each MTJ equally.

In each embodiment, preferably, the cap layer 262 is formed over a substantial portion of the second magnetic layer 216. For example, the cap layer 262 may be formed over at least about 80% of the second magnetic layer 216. More preferably, the cap layer 262 is formed over at least about 90% of the second magnetic layer 216, in accordance with embodiments of the present invention.

Figure 11:
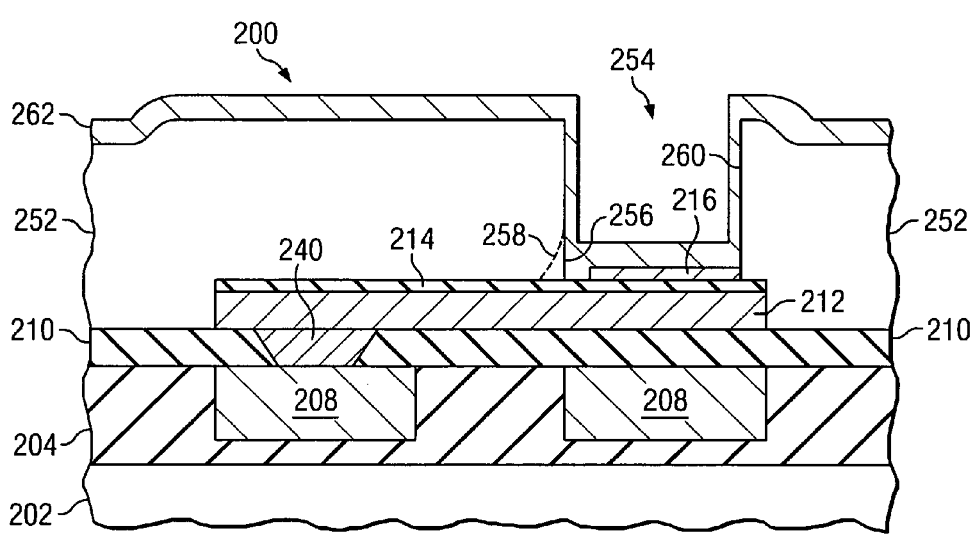

After the layer of resist 252 is patterned with the third pattern, a cap layer material 262 is deposited over the patterned resist 252 and the exposed second magnetic layer 216 (and tunnel insulator 214, if exposed), as shown in FIG. 11. The cap layer material 262 preferably comprises about 50 to 1000 Angstroms of a conductive material, and more preferably comprises a thickness of about 500 Angstroms or less. In one embodiment the cap layer material 262 comprises a thickness of about 200 Angstroms or less. These dimensions for the cap layer material 262 are listed as examples, although the cap layer material 262 may alternatively comprise other dimensions.

The cap layer material 262 preferably comprises a conductive material so that electrical contact will be made between the second magnetic layer 216 and a subsequently formed second conductive line 230, as shown in FIG. 13. For example, the cap layer material 262 preferably comprises TaN, Ta, TiN, Ti, or Ru, or combinations thereof. The cap layer material 262 may be deposited by PVD, chemical vapor deposition (CVD), or other suitable deposition methods, as examples. In one embodiment, the cap layer material 262 preferably comprises TaN deposited by PVD, as an example.

The device 200 may be subjected to a sputter precleaning process prior to depositing the cap layer material 262, to remove any materials or oxides such as NiFeO that may have been formed on the top surface of the second magnetic layer 216, for example.

Next, the resist 252 is removed, using a strip process, for example, although other processes may be used. Because the portions of the cap layer material 262 reside over the resist 252, these portions of the cap layer material 262 are removed when the resist 252 is removed, leaving the structure shown in FIG. 12. Removing material formed over a resist during a resist strip process is referred to herein as a "lift-off" technique. Thus, the cap layer 262 is formed using a lift-off technique in this embodiment.

Figure 12:
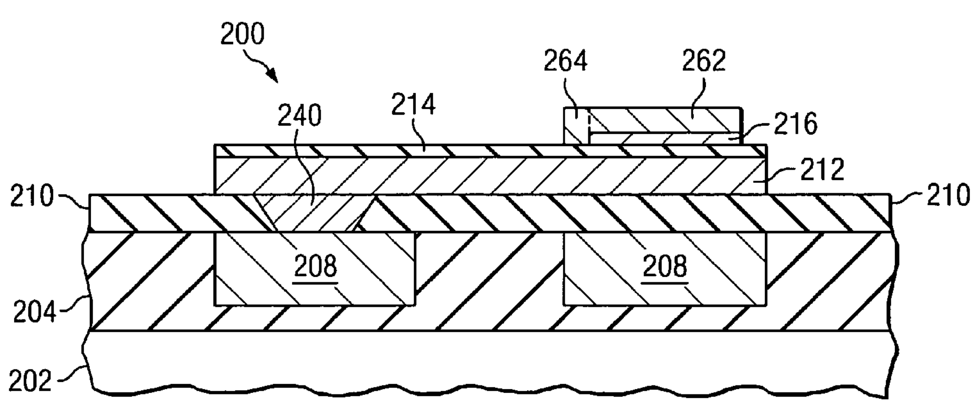

Again, the third pattern of the cap layer 262 may be slightly larger than the first pattern of the second magnetic layer 216, as shown in FIG. 12 at 264, or it may be slightly smaller than the first pattern of the second magnetic layer 216, as shown in FIG. 13 at 266. Alternatively, the cap layer 262 third pattern may be substantially equal to the first pattern of the second magnetic layer 216. Preferably, the third pattern of the cap layer 262 is smaller than the second pattern of the tunnel insulator 214 and the first magnetic layer 212, as shown.

Next, the manufacturing process for the MRAM device is continued to complete the device 200. For example, a third insulating layer 226 may be disposed between adjacent MTJ's (which comprise the second magnetic layer 216, and the tunnel insulator 214 and first magnetic layer 212 disposed beneath the second magnetic layer 216). The third insulating layer 226 may be planarized using a chemical mechanical polish (CMP) process. A fourth insulating layer 232 may be disposed over the MTJ's and the third insulating layer 226, and second conductive lines 230 comprising similar materials described for first conductive lines 208 may be formed within the fourth insulating layer 232, as shown in FIG. 13. Each second conductive line 230 preferably is formed over and abuts an MTJ, as shown. Additional insulating layers are deposited, and contacts are made to underlying elements (not shown).

The second, third and fourth insulating layers 210, 226 and 232 may comprise silicon dioxide, low dielectric constant materials, other insulating materials, or combinations or multiple layers thereof, as examples, although alternatively, the second, third and fourth insulating layers 210, 226 and 232 may comprise other materials.

The second conductive lines 230 may comprise bitlines of an MRAM array, and the first conductive lines 208 may comprise wordlines, for example. Alternatively, the converse may be true. For example, the second conductive lines 230 may comprise wordlines of an MRAM array, and the first conductive lines 208 may comprise bitlines. In a crosspoint MRAM array, the wordlines and bitlines 230 and 208 are used to access a particular MTJ. In a FET MRAM array, an underlying FET formed in the workpiece 202 (not shown), bitlines 230 or 208, and wordlines 208 or 230 may be used to select a particular MRAM memory cell, for example.

Because the cap layer 262 is formed using a lift-off technique, rather than being used as a hard mask to pattern underlying material layers such as second magnetic layer 216, advantageously, the second magnetic layer 216 may be wet etched in accordance with embodiments of the present invention.

FIGS. 14 through 18 show cross-sectional views of another preferred embodiment of the present invention, wherein a hard mask/photoresist lift-off technique is used to form a cap layer over an MTJ after patterning the free layer or second magnetic layer. Again, like numerals are used for the various elements in FIGS. 14 through 18 as were described with reference to FIGS. 1 through 3 and 4 through 13, and to avoid repetition, each reference number shown in the diagram may not necessarily be described again in detail herein. Rather, similar materials x02, x04, x06, x08, etc . . . are preferably used for the material layers shown as were described for FIGS. 1 through 3 and 4 through 13, where x=1 in FIGS. 1 through 3, x=2 in FIGS. 4 through 13, and x=3 in FIGS. 14 through 18.

Figure 14:
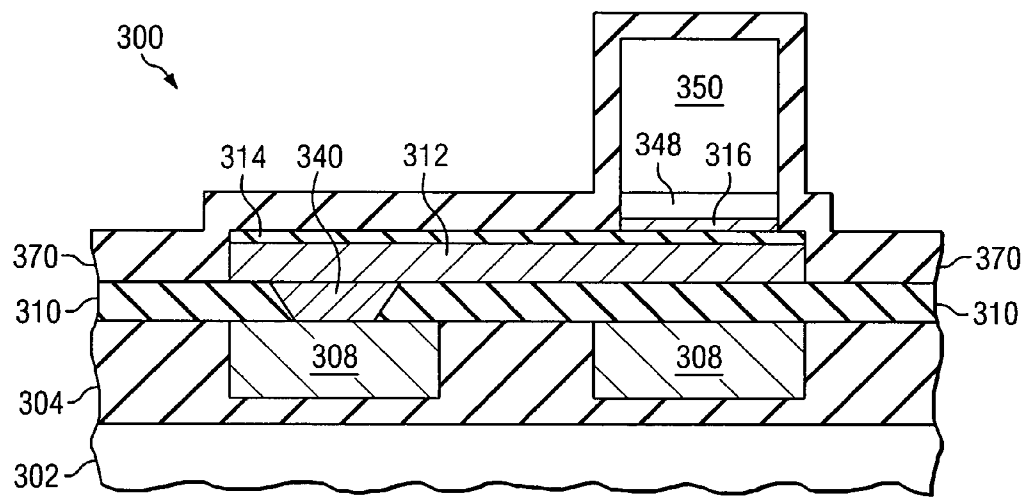
FIGS. 14 through 18 show cross-sectional views of another preferred embodiment of the present invention, wherein a hard mask/photoresist lift-off technique is used to form a cap layer over an MTJ after patterning the free layer.

In this embodiment, a lift-off technique is used to form a hard mask 370 over all exposed material layers 310 and 314 of the MRAM device 300 and remove the hard mask 370 from over the second magnetic layer 316. After patterning the second magnetic layer 216 with the first pattern using a wet etch process using the resist 250 and optional ARC 248 as a mask, as shown in FIG. 8, preferably the resist 350 and optional ARC 348 used to pattern the second magnetic layer 316 are left remaining over the second magnetic layer 316, as shown in FIG. 14. A hard mask 370 is deposited over the resist 350, optional ARC 348, and exposed portions of the tunnel insulator 314 and second insulating layer 310, as shown. The hard mask 370 preferably comprises an insulating material, such as SiN, SiC, SiO, SON, SiCN, combinations thereof, or multiple layers thereof, as examples, although alternatively, the hard mask 370 may comprise other materials. The hard mask 370 preferably comprises a thickness of about 1000 Angstroms or less of material, although alternatively, the hard mask 370 may comprise other dimensions, for example.

If the optional ARC 348 is used, preferably, the ARC 348 comprises a SiON dielectric material, and preferably the hard mask 370 material comprises SiC, SiCN or combinations thereof, for example.

Figure 15:
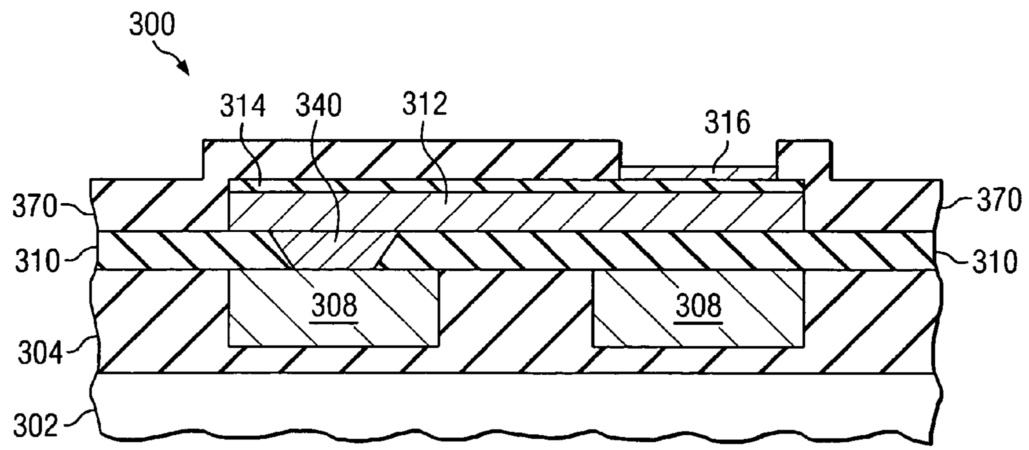

After the hard mask 370 is deposited over the resist 350 and optional ARC 348, the resist 350 and ARC 348 are stripped or removed, also removing the hard mask 370 over the top surface of the resist 350, in a lift-off technique. The remaining structure is shown in FIG. 15, wherein the hard mask 370 is left residing over the tunnel insulator 314 and portions of second insulating layer 310, and wherein the second magnetic layer 316 is left exposed.

Figure 16:
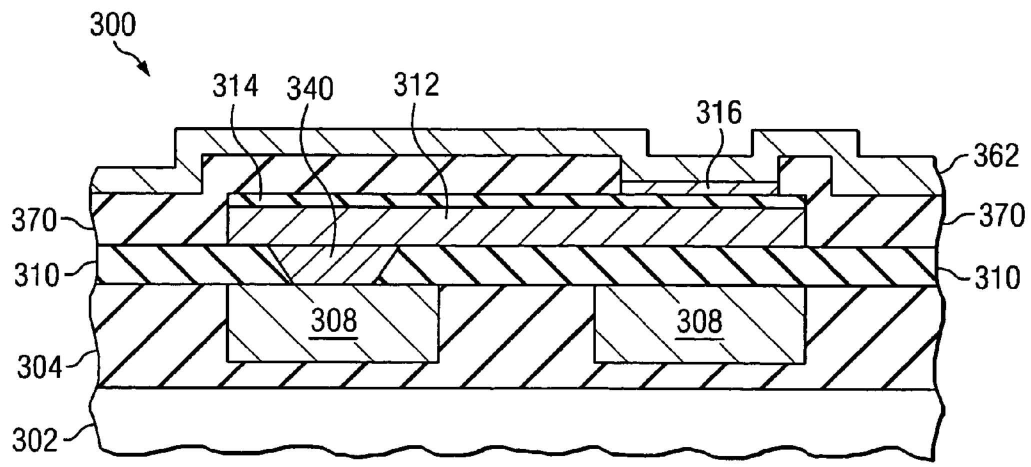

A cap layer material 362 is then deposited over the exposed second insulating layer 310, tunnel insulator 314 and portions of second insulating layer 310, as shown in FIG. 16. The cap layer material 362 may comprise about 1000 Angstroms or less of TaN, Ta, TiN, Ti, or Ru, or combinations thereof, as example.

Figure 17:
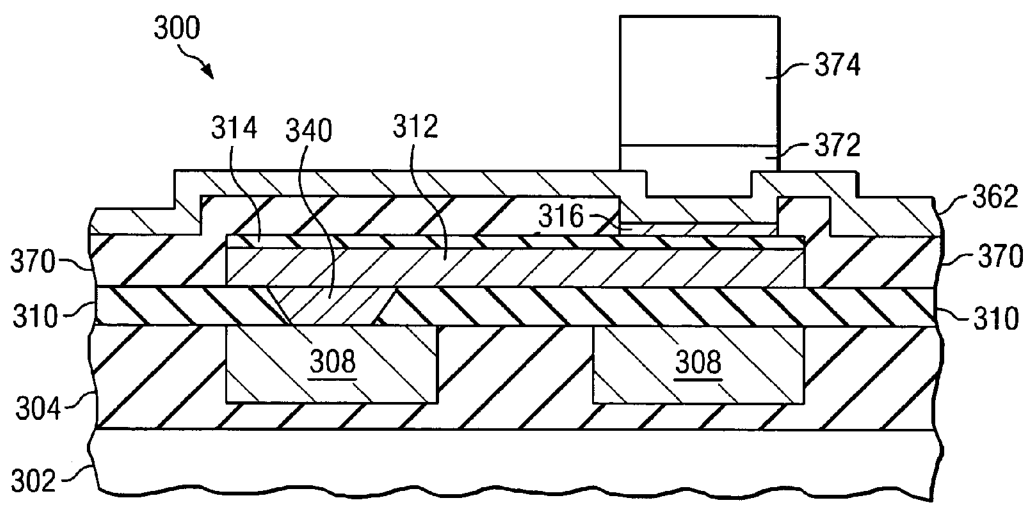
Figure 18:
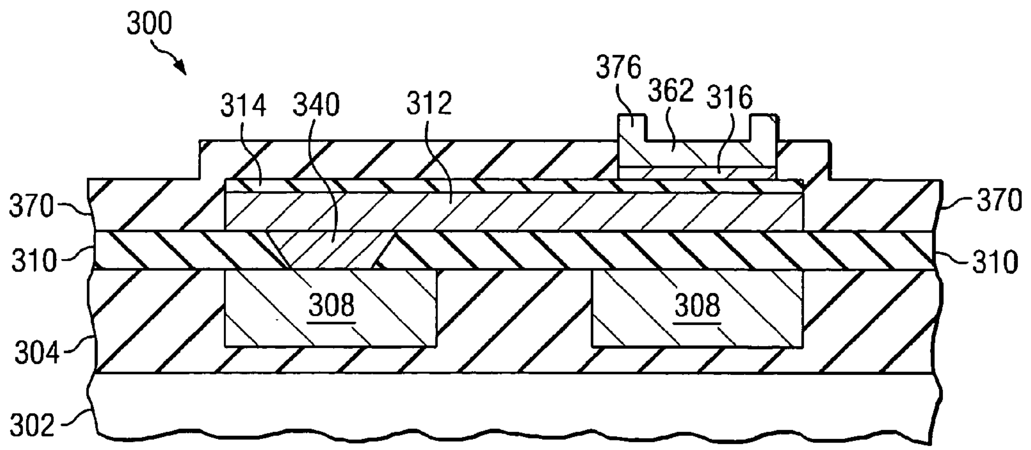

Another optional ARC 372 and another layer of resist 374 are deposited over the cap layer material 362, as shown in FIG. 17. The resist 374 and ARC 372 are patterned with the third pattern for the cap layer 362, and the resist 374 and ARC 372 are used as a mask while the cap layer material 362 is patterned, leaving the structure shown in FIG. 18. Any excess cap layer material 376 remaining over the edges of the cap layer 362 may be removed during the CMP of the insulating layer disposed between the MTJ's, for example. Conductive lines are then formed over the cap layer 362 (not shown: see FIG. 13).

In this embodiment, the third pattern of the cap layer 362 may comprise the same size as the first pattern of the second magnetic layer 316. This is advantageous in that the same mask can be used to pattern resist 374 in FIG. 17 and resist 350 in FIG. 14. Alternatively, the third pattern of the cap layer 362 may be slightly larger or smaller than the first pattern of the second magnetic layer 316, as described with reference to and shown in FIG. 13.

Advantages of embodiments of the present invention include. providing methods of forming an MTJ or magnetic memory cell, wherein conductive fences are not formed on sidewalls of the various material layers of the MTJ. Methods of patterning MTJ's of MRAM devices are described herein wherein a wet etch process may be used to pattern the top magnetic material layer. A cap layer is then formed over the patterned top magnetic material layer using a lift-off technique, wherein when resist is removed, a material disposed over the resist is also removed. Because a wet etching process is used to pattern the top magnetic material layer of the MTJ, lateral etching of the top magnetic material layer is reduced or eliminated. MRAM devices with improved performance and increased yields are achieved by embodiments of the invention.

The cap layer 262/362 described herein provides thermal stability and magnetic stability for MTJ's of MRAM devices. The cap layer 262/362 also prevents diffusion of materials from subsequently formed conductive lines 230 to the second magnetic layer 216/316, and also prevents diffusion of materials in the second magnetic layer 216/316 into the conductive lines 230.

The lift-off techniques described herein for forming a cap layer 262/362 over an MTJ provide solutions for the difficulties faced in etching magnetic material layers of MTJ's. Damage to the edges of the free layer or second magnetic layer 216/316 is prevented, and damage to the MTJ's caused by by-products of dry etching of magnetic materials is avoided, with embodiments of the present invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:

providing a workpiece;

depositing a first magnetic layer over the workpiece;

depositing a tunnel insulator over the first magnetic layer;

depositing a second magnetic layer over the tunnel insulator, wherein the second magnetic layer, tunnel insulator, and first magnetic layer form a magnetic stack;

patterning the second magnetic layer, tunnel insulator, and first magnetic layer, wherein the second magnetic layer comprises a first pattern and the tunnel insulator and the first magnetic layer comprise a second pattern, the second pattern being larger than the first pattern, wherein the second magnetic layer comprises a top surface, and wherein patterning the second magnetic layer comprises a wet etch process; and after patterning the second magnetic layer, forming a conductive cap layer over at least a substantial portion of the top surface of the second magnetic layer.

2. The method according to claim 1, wherein the wet etch process comprises a dicarboxylic acid aqueous etchant solution adapted to stop on the tunnel insulator.

3. The method according to claim 2, wherein the dicarboxylic acid of the wet etch process comprises glutaric acid, adipic acid, or suberic acid.

4. The method according to claim 1, wherein the method includes patterning the tunnel insulator and the first magnetic layer before depositing the second magnetic layer.

5. The method according to claim 1, wherein the method includes patterning the tunnel insulator and the first magnetic layer after depositing the second magnetic layer.

6. The method according to claim 1, wherein forming the cap layer comprises forming the cap layer over the entire top surface of the second magnetic layer.

7. The method according to claim 6, wherein forming the cap layer further comprises forming the cap layer over a portion of the tunnel insulator proximate the second magnetic layer.

8. The method according to claim 1, wherein forming the cap layer comprises a lift-off technique.

9. The method according to claim 8, wherein forming the cap layer comprises depositing TaN, Ta, TiN, Ti, or Ru, or combinations thereof.

10. The method according to claim 8, wherein forming the cap layer comprises depositing about 500 Angstroms of material or less.

11. The method according to claim 8, wherein forming the cap layer comprises:

depositing a resist over the second magnetic layer;

patterning the resist to expose at least a portion of the second magnetic layer top surface;

depositing a cap layer material over the resist and exposed at least a portion of the second magnetic layer top surface; and removing the resist, wherein removing the resist comprises removing excess cap layer material disposed over the resist, leaving the cap layer over the at least a portion of the second magnetic layer top surface.

12. The method according to claim 11, wherein patterning the resist comprises exposing the entire top surface of the second magnetic layer, wherein removing the resist comprises leaving the cap layer residing over the entire top surface of the second magnetic layer.

13. The method according to claim 12, wherein patterning the resist further comprises exposing a portion of the tunnel insulator proximate the second magnetic layer, wherein removing the resist further comprises leaving the cap layer residing over a portion of the tunnel insulator proximate the second magnetic layer.

14. The method according to claim 13, wherein exposing a portion of the tunnel insulator comprises negatively sloping the resist proximate the tunnel insulator while patterning the resist.

15. The method according to claim 8, wherein forming the cap layer comprises:

forming a first resist over the second magnetic layer;

depositing a hard mask over the first resist and the tunnel insulator;

removing the first resist, wherein removing the first resist comprises removing the hard mask over the first resist;

depositing a cap layer material over the hard mask and the second magnetic layer;

depositing a second resist over the cap layer material;

patterning the second resist, leaving the second resist residing over the second magnetic material; and removing the second resist, wherein removing the second resist comprises removing the cap layer material from over the tunnel insulator, leaving the cap layer over the second magnetic layer.

16. The method according to claim 15, wherein depositing the hard mask comprises depositing SiN, SiC, SiO, SON, SiCN, combinations thereof, or multiple layers thereof.

17. The method according to claim 15, wherein depositing the hard mask comprises depositing about 1000 Angstroms or less of material.

18. The method according to claim 15, wherein patterning the second magnetic layer comprises using the first resist as a mask.

19. The method according to claim 15, wherein forming the first resist over the second magnetic layer comprises depositing the first resist over the second magnetic layer and patterning the first resist using a lithography mask, and wherein patterning the second resist comprises using the same lithography mask used to pattern the first resist.

20. The method according to claim 1, wherein the second magnetic layer, tunnel insulator and first magnetic layer comprise a magnetic tunnel junction (MTJ) of a magnetic random access memory (MRAM) device, wherein the method includes forming a plurality of MTJ's over the workpiece.

21. The method according to claim 20, further comprising:

forming a first insulating layer over the workpiece, before depositing the first magnetic layer;

forming a plurality of first conductive lines in the first insulating layer, the first conductive lines being positioned in a first direction, wherein depositing a first magnetic layer over the workpiece comprises depositing the first magnetic layer over the first insulating layer and the first conductive lines, and wherein each MTJ is disposed over at least one of the plurality of first conductive lines;

forming a second insulating layer over the first insulating layer and between and over the MTJ's; and forming a plurality of second conductive lines in the second insulating layer, the second conductive lines being positioned in a second direction, the second direction being different from the first direction, wherein each second conductive line abuts the cap layer over an MTJ.

22. The method according to claim 21, wherein the semiconductor device comprises a field-effect transistor (FET) or crosspoint MRAM device, wherein the plurality of first conductive lines and the plurality of second conductive lines comprise wordlines and bitlines of the MRAM device, and wherein the MTJ's comprise magnetic memory cells.

23. A method of manufacturing a magnetic random access memory (MRAM) device, the method comprising:

forming a plurality of first conductive lines over a workpiece, the first conductive lines being positioned in a first direction;

forming a plurality of magnetic tunnel junctions (MTJ's) over the first conductive lines, wherein each MTJ is disposed over one of the first conductive lines, the MTJ's including a first magnetic layer, a tunnel insulator disposed over the first magnetic layer, and a second magnetic layer disposed over the tunnel insulator, wherein the second magnetic layer comprises a first pattern and the tunnel insulator and the first magnetic layer comprise a second pattern, the second pattern being larger than the first pattern, wherein the second magnetic layer comprises a top surface;

depositing a resist over at least the second magnetic layer and the tunnel insulator;

patterning the resist to expose at least a portion of the second magnetic layer top surface;

depositing a cap layer material over the resist and exposed at least a portion of the second magnetic layer top surface;

removing the resist, wherein removing the resist comprises removing excess cap layer material disposed over the resist, leaving a cap layer over the at least a portion of the second magnetic layer top surface of each MTJ; and forming a plurality of second conductive lines over the cap layer of the MTJ's, the second conductive lines being positioned in a second direction, the second direction being different from the first direction, wherein each second conductive line abuts the cap layer over an MTJ.

24. The method according to claim 23, wherein patterning the resist comprises exposing the entire top surface of the second magnetic layer, wherein removing the resist comprises leaving the cap layer residing over the entire top surface of the second magnetic layer.

25. The method according to claim 24, wherein patterning the resist further comprises exposing a portion of the tunnel insulator proximate the second magnetic layer, wherein removing the resist further comprises leaving the cap layer residing over a portion of the tunnel insulator proximate the second magnetic layer.

26. The method according to claim 25, wherein exposing a portion of the tunnel insulator comprises negatively sloping the resist proximate the tunnel insulator while patterning the resist.

27. The method according to claim 23, wherein forming the plurality of MTJ's comprises patterning the second magnetic layer of the MTJ's using a wet etch process.

28. The method according to claim 23, wherein depositing the cap layer material comprises depositing about 500 Angstroms or less of TaN, Ta, TiN, Ti, or Ru, or combinations thereof.

29. A method of manufacturing a magnetic random access memory (MRAM) device, the method comprising:

forming a plurality of first conductive lines over a workpiece, the first conductive lines being positioned in a first direction;

forming a plurality of magnetic tunnel junctions (MTJ's) over the first conductive lines, wherein each MTJ is disposed over one of the first conductive lines, the MTJ's including a first magnetic layer, a tunnel insulator disposed over the first magnetic layer, and a second magnetic layer disposed over the tunnel insulator, wherein the second magnetic layer comprises a first pattern and the tunnel insulator and the first magnetic layer comprise a second pattern, the second pattern being larger than the first pattern, wherein the second magnetic layer comprises a top surface;

forming a first resist over at least the second magnetic layer and the tunnel insulator;

depositing a hard mask over the first resist and the tunnel insulator;

removing the first resist, wherein removing the first resist comprises removing the hard mask over the first resist;

depositing a cap layer material over the hard mask and the second magnetic layer;

depositing a second resist over the cap layer material;

patterning the second resist, leaving the second resist residing over the second magnetic material;

removing the second resist, wherein removing the second resist comprises removing the cap layer material from over the tunnel insulator, leaving a cap layer over the second magnetic layer top surface of each MTJ; and forming a plurality of second conductive lines over the cap layer of the MTJ's, the second conductive lines being positioned in a second direction, the second direction being different from the first direction, wherein each second conductive line abuts the cap layer over an MTJ.

30. The method according to claim 29, wherein depositing the hard mask comprises depositing SiN, SiC, SiO, SON, SiCN, combinations thereof, or multiple layers thereof.

31. The method according to claim 29, wherein depositing the hard mask comprises depositing about 1000 Angstroms or less of material.

32. The method according to claim 29, wherein the second magnetic layer is patterned using the first resist as a mask.

33. The method according to claim 29, wherein forming the first resist over the second magnetic layer comprises depositing the first resist over the second magnetic layer and patterning the first resist using a lithography mask, and wherein patterning the second resist comprises using the same lithography mask used to pattern the first resist.

34. The method according to claim 29, wherein forming the plurality of MTJ's comprises patterning the second magnetic layer of the MTJ's using a wet etch process.

35. The method according to claim 29, wherein depositing the cap layer material comprises depositing about 500 Angstroms or less of TaN, Ta, TiN, Ti, or Ru, or combinations thereof.

* * * * *